United States Patent
Hanson et al.

(10) Patent No.: US 12,255,647 B2
(45) Date of Patent: Mar. 18, 2025

(54) MEMORY MODULE WITH FINE-GRAINED VOLTAGE ADJUSTMENT CAPABILITIES

(71) Applicant: Ambiq Micro, Inc., Austin, TX (US)

(72) Inventors: Scott Hanson, Austin, TX (US); Daniel Martin Cermak, Austin, TX (US)

(73) Assignee: AMBIQ MICRO, INC., Austin, TX (US)

( * ) Notice: Subject to any disclaimer, the term of this patent is extended or adjusted under 35 U.S.C. 154(b) by 0 days.

(21) Appl. No.: 18/214,947

(22) Filed: Jun. 27, 2023

(65) Prior Publication Data
US 2024/0072806 A1    Feb. 29, 2024

Related U.S. Application Data

(63) Continuation of application No. 17/894,023, filed on Aug. 23, 2022, now Pat. No. 11,689,204.

(51) Int. Cl.
| | |
|---|---|
| H03K 19/17784 | (2020.01) |
| H03K 19/173 | (2006.01) |
| H03K 19/1776 | (2020.01) |

(52) U.S. Cl.
CPC ... *H03K 19/17784* (2013.01); *H03K 19/1737* (2013.01); *H03K 19/1776* (2013.01)

(58) Field of Classification Search
None
See application file for complete search history.

(56) References Cited

U.S. PATENT DOCUMENTS

| | | |
|---|---|---|
| 10,466,766 B2 | 11/2019 | Arimilli et al. |
| 10,545,563 B2 | 1/2020 | Kiyozaki |
| 10,564,692 B2 | 2/2020 | Choi |
| 10,691,195 B2 | 6/2020 | Srinivas et al. |
| 10,788,884 B2 | 9/2020 | Hanson et al. |

(Continued)

FOREIGN PATENT DOCUMENTS

| | | |
|---|---|---|
| CN | 108735246 A | 11/2018 |
| CN | 111316234 A | 6/2020 |

(Continued)

OTHER PUBLICATIONS

"Acpi." Wikipedia, Jul. 31, 2022, https://en.wikipedia.org/w/index.php?title=ACPI&oldid=1101579582.

(Continued)

*Primary Examiner* — Jany Richardson
(74) *Attorney, Agent, or Firm* — Nixon Peabody LLP

(57) ABSTRACT

Embodiments of the disclosure are directed to a system having a memory module, a voltage generation module, and a plurality of multiplexors. The memory module has a plurality of memory blocks. The voltage generation module supplies two or more voltage rails. The multiplexors are electrically connected to the voltage generation module. Each memory block is electrically connected to one of the multiplexors. Each multiplexor is configured to switch between the two or more voltage rails based on an operational parameter of each memory block. The operational parameter of each memory block may be process control speed, storage status, an operating mode, temperature, or any combination thereof. The operating mode may further be an active mode, a standby mode, and a deep sleep mode.

20 Claims, 5 Drawing Sheets

(56) References Cited

U.S. PATENT DOCUMENTS

| | | | |
|---|---|---|---|
| 11,474,888 B2 | 10/2022 | Spica et al. | |
| 11,822,364 B2 | 11/2023 | Mclean et al. | |
| 2008/0198679 A1* | 8/2008 | Lysinger | G11C 11/413 |
| | | | 365/229 |
| 2010/0254209 A1* | 10/2010 | Lee | G11C 5/063 |
| | | | 365/226 |
| 2011/0194358 A1 | 8/2011 | Choi | |
| 2014/0167813 A1 | 6/2014 | Raychowdhury et al. | |
| 2018/0299939 A1 | 10/2018 | Kiyozaki | |
| 2019/0079574 A1 | 3/2019 | Hanson et al. | |
| 2020/0019229 A1 | 1/2020 | Srinivas et al. | |

FOREIGN PATENT DOCUMENTS

| | | |
|---|---|---|
| CN | 113383386 A | 9/2021 |
| TW | 201942903 A | 11/2019 |

OTHER PUBLICATIONS

First Office Action issued in CN202311066502 on May 1, 2024 [English Translation] (17 pages).
First Office Action issued in TW112131747 on Nov. 13, 2023 [English Translation] (12 pages).

\* cited by examiner

MEMORY MODULE WITH FINE-GRAINED VOLTAGE ADJUSTMENT CAPABILITIES

The present disclosure is a continuation of U.S. application Ser. No. 17/894,023, filed on Aug. 22, 2022. The contents of that application are hereby incorporated by reference in its entirety.

TECHNICAL FIELD

The present disclosure relates generally to system on chip microcontrollers. More particularly, aspects of this disclosure relate to a system that reduces power consumption for a memory module in a microcontroller system by providing fine-grained voltage adjustment capabilities.

BACKGROUND

In recent years, due to the growth of portable electronics, there has been a push to decrease the power used by microcontrollers (or "MCU"), microprocessors, application processors, digital signal processors (DSPs), neural processing units (NPUs), and other circuits used in portable electronic appliances. With lower power requirements, effective electronics operation time can be extended, or alternatively, smaller batteries can be used. Commonly, the power consumption of a microcontroller and associated circuits may be reduced by using a lower supply voltage, or by reducing the amount of internal capacitance being charged and discharged during the operation of the circuit.

One method for reducing microcontroller power relies on hardware or software-based power mode switching. Power modes can be selected for microcontroller components or resources based on operating state, operating conditions, and/or sleep cycle characteristics and other factors to configure low power modes for selected microcontroller components at the time the processor enters a low power or sleep state. In some systems, a set of predefined low power configurations can be used, while more sophisticated systems can dynamically select low power configurations to maximize power savings while still meeting system latency requirements.

Currently, the voltage applied to all memory cells in a memory module in the microcontroller system is a single voltage for all the bitcells during various operating modes. The operating modes may be power modes such as an active mode, a standby mode, and a deep sleep mode. The retention voltage for the entire memory chip is traditionally determined using the single worst case bitcell at the worst case process corner at the chip level. One bad bitcell requires running all bitcells in the chip at a conservatively high voltage level, even if the good bitcells could be run at a lower voltage level. This consumes significant power that is wasted for the good bitcells. Accordingly, it is desirable to have a microcontroller system that provides a reliable overall power management protocol and reduces power consumption for the memory chips therein by adjusting voltages for different cells of a memory module.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a system includes a memory module, a voltage generation module, and a plurality of multiplexors. The memory module has a plurality of memory blocks. The voltage generation module supplies two or more voltage rails. The multiplexors are electrically connected to the voltage generation module. Each memory block is electrically connected to one of the multiplexors. Each multiplexor is configured to switch between the two or more voltage rails based on an operational parameter of each memory block.

In another disclosed implementation of the example system, the system includes a voltage selection module electrically connected to each of the multiplexors and configured to select one of the two or more voltage rails for each multiplexor. In another disclosed implementation, the example system includes a data storage device coupled to the voltage selection module to store the selection of the voltage rails for each multiplexor. In another disclosed implementation, one of the voltage rails is delivered at one of a near-threshold voltage, super-threshold voltage, or a sub-threshold voltage. In another disclosed implementation, at least one of the two or more voltage rails changes as a function of temperature. In another disclosed implementation, the function of temperature is complementary to absolute temperature of the system. In another disclosed implementation, the operational parameter is a manufacturing process corner, a read or write delay, a minimum operating voltage, a storage status, an operating mode, a temperature, or any combination thereof. In another disclosed implementation, the operating mode of each memory block is a power mode including an active mode, a standby mode, and a deep sleep mode. In another disclosed implementation, a memory block with a slow process corner is assigned a first voltage and a memory block with fast process corner is assigned a second voltage, wherein the first voltage is higher than the second voltage.

According to certain aspects of the present disclosure, a method includes determining an operational parameter of an individual memory block within a memory module. The memory module includes a plurality of the memory blocks. The method further includes selecting one of a plurality of voltage rails provided by a voltage generation module based on the operational parameter such that a voltage required to retain data in the individual memory block is minimized.

In another disclosed implementation of the example method, the method includes transmitting the voltage selection signal to a multiplexor to electrically connect the individual memory block to the selected voltage rail. In another disclosed implementation, the operational parameter is a manufacturing process corner, a read or write delay, a minimum operating voltage, a storage status, an operating mode, a temperature, or any combination thereof. In another disclosed implementation, the operating mode of each memory block is a power mode including an active mode, a standby mode, and a deep sleep mode. In another disclosed implementation, a memory block with a slow process corner is assigned a first voltage and a memory block with fast process corner is assigned a second voltage, wherein the first voltage is higher than the second voltage. In another disclosed implementation, one of the voltage rails is delivered at one of a near-threshold voltage, super-threshold voltage, or a sub-threshold voltage.

According to certain aspects of the present disclosure, a non-transitory computer-readable medium having machine-readable instructions stored thereon, is disclosed. The machine-readable instructions when executed by a processor cause the processor to determine an operational parameter of an individual memory block within a memory module. The memory module includes a plurality of the memory blocks. The machine-readable instructions further cause the processor to select one of a plurality of voltage rails provided by a voltage generation module based on the operational parameter such that a voltage required to retain data in the individual memory block is minimized. The machine-readable instructions further cause the processor to generate a voltage selection signal based on the selected voltage rail.

In another disclosed implementation of the example non-transitory computer-readable medium, the medium further stores machine-readable instructions that cause the processor to transmit the voltage selection signal to a multiplexor to electrically connect the individual memory block to the selected voltage rail. In another disclosed implementation, the operational parameter is a manufacturing process corner, a read or write delay, a minimum operating voltage, a storage status, an operating mode, a temperature, or any combination thereof. In another disclosed implementation, the operating mode of each memory block is a power mode including an active mode, a standby mode, and a deep sleep mode. In another disclosed implementation, one of the voltage rails delivers one of a near-threshold voltage, super-threshold voltage, or a sub-threshold voltage.

BRIEF DESCRIPTION OF THE DRAWINGS

The disclosure will be better understood from the following description of exemplary embodiments together with reference to the accompanying drawings, in which.

Figure 1:
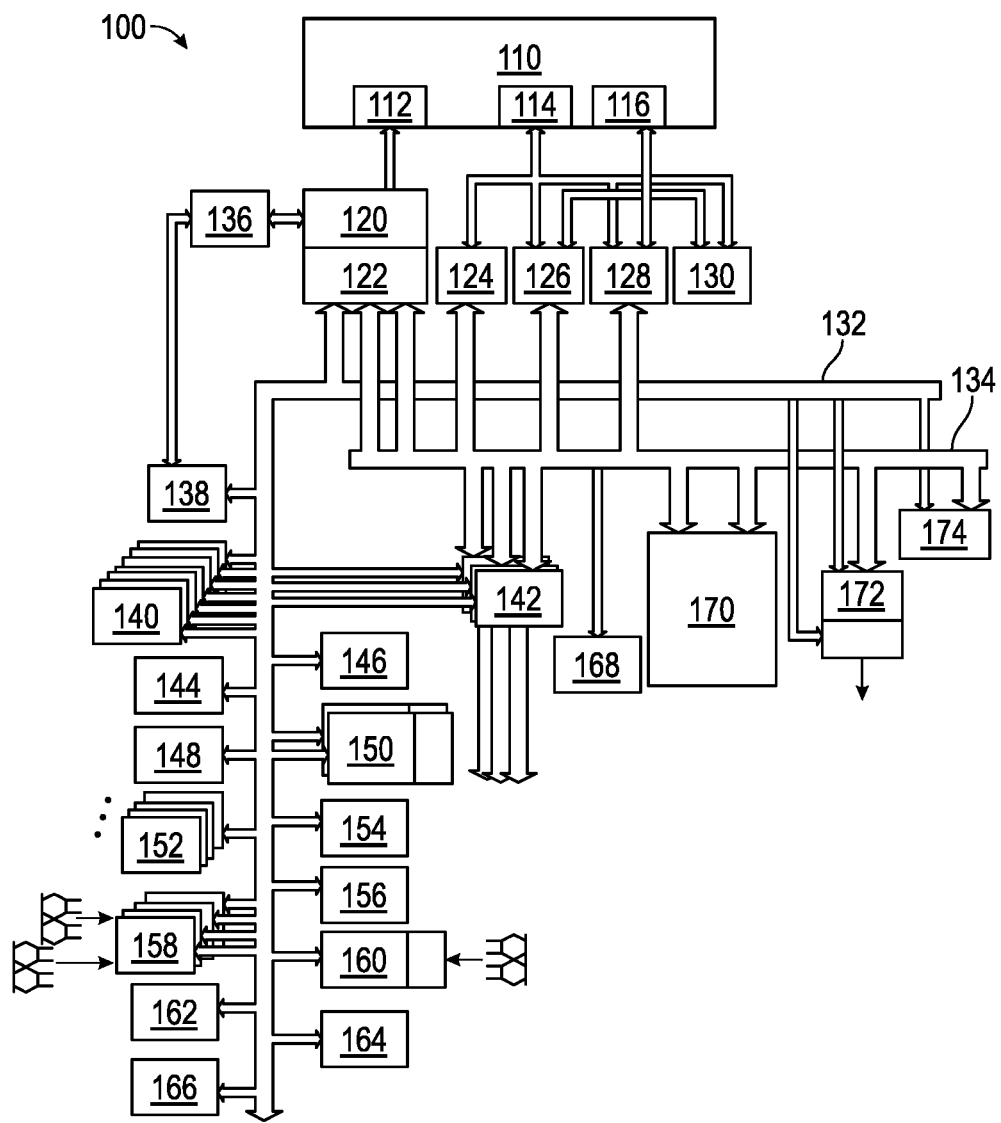
FIG. 1 is a block diagram of the example low power microcontroller system, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein. Further, it is noted that the term "signal" means a waveform (e.g., electrical, optical, magnetic, mechanical or electromagnetic) capable of traveling through a medium such as DC, AC, sinusoidal-wave, triangular-wave, square-wave, vibration, and the like.

Embodiments of this disclosure relate to a system that reduces power consumption for a memory module in a microcontroller system by providing fine-grained voltage adjustment capabilities. The system includes multiplexors that dynamically switch between voltage rails from a voltage source to deliver customized voltage options for individual or groups of memory blocks in the memory module, based on an operational parameter of the memory blocks. Thus, as the microcontroller system switches between an active mode and a deep sleep mode, a customized voltage may be delivered to individual memory blocks based on their workload, storage status, process control speed, temperature, etc. This results in a minimally necessary voltage being applied to the individual memory block and the memory module, thereby significantly reducing power consumption of the microcontroller system.

FIGS. 1A-1B are a block diagram of an example low power microcontroller system 100. The low power microcontroller system 100 includes a central processing unit (CPU) 110. In some embodiments, the CPU 110 in this example is Cortex M4F (CM4) with a floating point unit. The CPU 110 includes a System-bus interface 112, a Data-bus interface 114, and an Instruction-bus interface 116. It is to be understood, that other types of general CPUs, or other processors such as DSPs or NPUs may incorporate the principles described herein.

The System-bus interface 112 is coupled to a Cortex M4 advanced peripheral bus (APB) bridge 120 that is coupled to an advanced peripheral bus (APB) direct memory access (DMA) module 122. The microcontroller system 100 includes a Data Advanced eXtensible Interface (DAXI) 124, a tightly coupled memory (TCM) 126, a cache 128, and a boot ROM 130. The Data-bus interface 114 allows access to the DAXI 124, the TCM 126, the cache 128, and the boot read only memory (ROM) 130. The Instruction-bus interface 116 allows access to the TCM 126, the cache 128, and the boot ROM 130. In this example, the DAXI interface 124 provides write buffering and caching functionality for the microcontroller system 100. The DAXI interface 124 improves performance when accessing peripherals like the SRAM and the MSPIs.

An Advanced Peripheral Bus (APB) 132 and an Advanced eXtensible Interface (AXI) bus 134 are provided for communication between components on the microcontroller system 100. The APB 132 is a low speed and low overhead interface that is used for communicating with peripherals and registers that do not require high performance and do not change often (e.g., when a controller wants to set configuration bits for a serial interface). The AXI bus 134 is an ARM standard bus protocol that allows high speed communications between multiple masters and multiple busses. This is useful for peripherals that exchange large amounts of data (e.g., a controller that talks to an ADC and needs to transfer ADC readings to a microcontroller or a GPU that talks to a memory and needs to transfer a large amount of graphics data to/from memories).

A fast general purpose input/output (GPIO) module 136 is coupled to the APB bridge 120. A GPIO module 138 is coupled to the fast GPIO module 136. The APB 132 is coupled to the GPIO module 138. The APB 132 is coupled to a series of Serial Peripheral Interface/Inter-Integrated Circuit (SPI/I2C) interfaces 140 and a series of Multi-bit Serial Peripheral Interfaces (MSPI)s 142. The MSPIs 142 are also coupled to the AXI bus 134 and provide access to external memory devices.

The APB 132 is also coupled to a SPI/I2C interface 144, a universal serial bus (USB) interface 146, an analog to digital converter (ADC) 148, an Integrated Inter-IC Sound Bus (I2S) interface 150, a set of Universal Asynchronous Receiver/Transmitters (UART)s 152, a timer module 154, a watch dog timer circuit 156, a series of pulse density modulation (PDM) interfaces 158, a low power audio ADC 160, a cryptography module 162, a Secure Digital Input Output/Embedded Multi-Media Card (SDIO/eMMC) interface 164, and a SPI/I2C slave interface module 166. The PDM interfaces 158 may be connected to external digital microphones. The low power audio ADC 160 may be connected to an external analog microphone through internal programmable gain amplifiers (PGA).

A system non-volatile memory (NVM), which is 2 MB in size in this example, is accessible through the AXI bus 134. A system static random access memory (SRAM) 170, which is 1 MB in this example is accessible through the AXI bus 134. The microcontroller system 100 further includes a display interface 172 and a graphics interface 174 that are coupled to the APB bus 132 and the AXI bus 134.

Components of the disclosed microcontroller system 100 are further described by U.S. Provisional Ser. No. 62/557,534, titled "Very Low Power Microcontroller System," filed Sep. 12, 2017; U.S. application Ser. No. 15/933,153, filed Mar. 22, 2018 titled "Very Low Power Microcontroller System," (Now U.S. Pat. No. 10,754,414), U.S. Provisional Ser. No. 62/066,218, titled "Method and Apparatus for Use in Low Power Integrated Circuit," filed Oct. 20, 2014; U.S. application Ser. No. 14/855,195, titled "Peripheral Clock Management," (Now U.S. Pat. No. 9,703,313), filed Sep. 15, 2015; U.S. application Ser. No. 15/516,883, titled "Adaptive Voltage Converter," (Now U.S. Pat. No. 10,338,632), filed Sep. 15, 2015; U.S. application Ser. No. 14/918,406, titled "Low Power Asynchronous Counters in a Synchronous System," (Now U.S. Pat. No. 9,772,648), filed Oct. 20, 2015; U.S. application Ser. No. 14/918,397, titled "Low Power Autonomous Peripheral Management," (Now U.S. Pat. No. 9,880,583), filed Oct. 20, 2015; U.S. application Ser. No. 14/879,863, titled "Low Power Automatic Calibration Method for High Frequency Oscillators," (Now U.S. Pat. No. 9,939,839), filed Oct. 9, 2015; U.S. application Ser. No. 14/918,437, titled "Method and Apparatus for Monitoring Energy Consumption," (Now U.S. Pat. No. 10,578,656), filed Oct. 20, 2015; U.S. application Ser. No. 17/081,378, titled "Improved Voice Activity Detection Using Zero Crossing Detection," filed Oct. 27, 2020, U.S. application Ser. No. 17/081,640, titled "Low Complexity Voice Activity Detection Algorithm," filed Oct. 27, 2020, all of which are hereby incorporated by reference.

Figure 2:
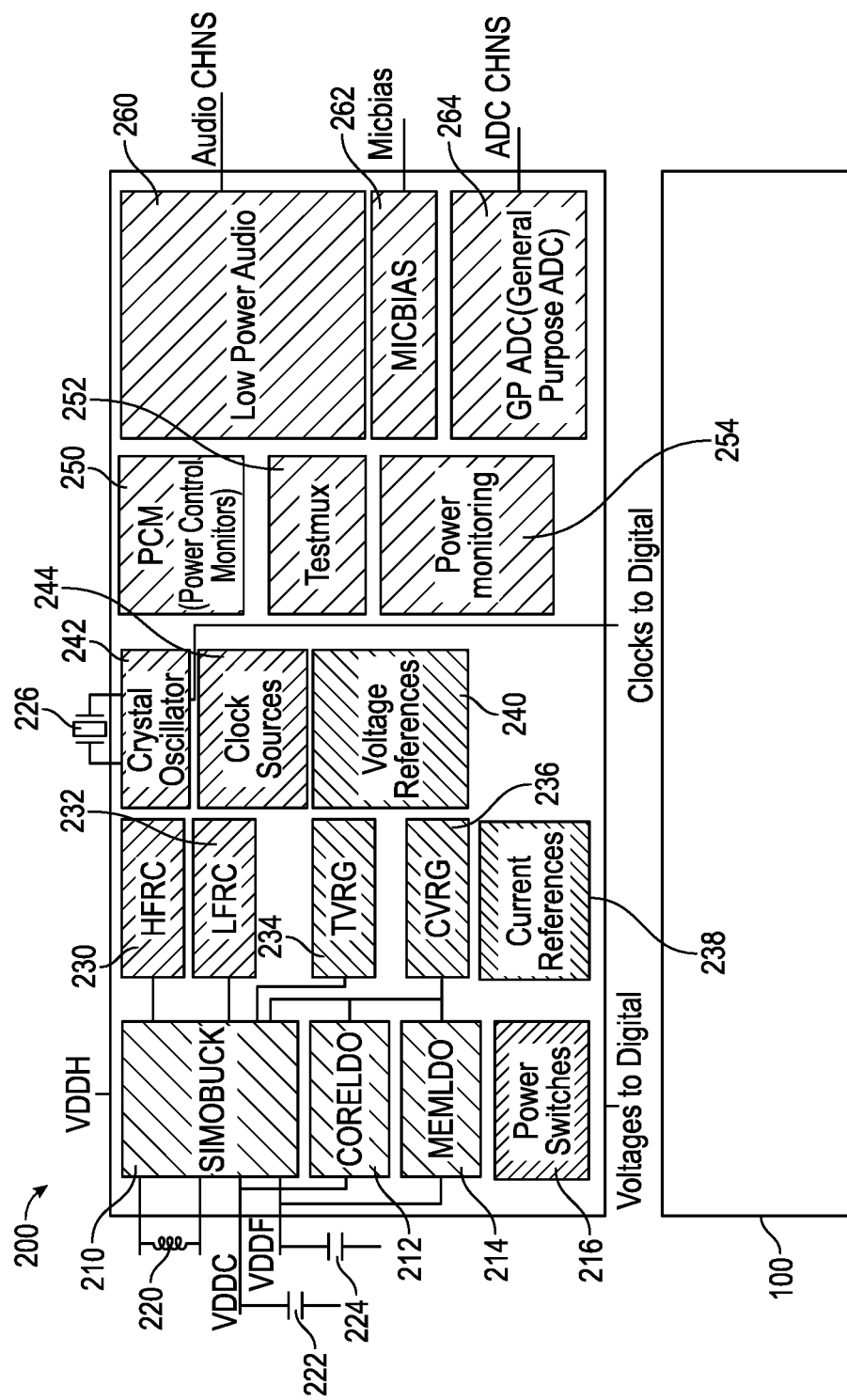
FIG. 2 is a block diagram of an example analog module that supplies power, external signals, and clock signals to the low power microcontroller system in FIG. 1, according to certain aspects of the present disclosure.

FIG. 2 shows a block diagram of an analog module 200 that interfaces external components with the microcontroller system 100 in FIG. 1. The analog module 200 supplies power to different components of the microprocessor system 100 as well as providing clocking signals to the microcontroller system 100. The analog module 200 includes a Single Inductor Multiple Output (SIMO) buck converter 210, a core low drop-out (LDO) voltage regulator 212, and a memory LDO voltage regulator 214. The SIMO buck converter 210 supplies DC voltage at different levels to components and devices of the microcontroller system 100 in FIG. 1 and the analog module 200 in FIG. 2. The LDO voltage regulator 212 supplies power to processor cores of the microcontroller system 100, while the memory LDO voltage regulator 214 supplies power to volatile memory devices of the microcontroller system 100, such as the SRAM 170. A switch module 216 represents switches that allow connection of power to the different components of the microcontroller system 100.

The SIMO buck converter 210 is coupled to an external inductor 220. The module 200 is coupled to a core VDD (VDDC) capacitor 222 and a memory VDD (VDDF) capacitor 224. The VDDC capacitor 222 smooths the voltage output of the core LDO voltage regulator 212 and the SIMO buck converter 210. The VDDF capacitor 224 smooths the voltage output of the memory LDO voltage regulator 214 and the SIMO buck converter 210. The analog module 200 is also coupled to an external crystal 226.

The SIMO buck converter 210 is coupled to a high frequency resistor-capacitor (HFRC) oscillator circuit 230, a low frequency resistor-capacitor (LFRC) circuit 232, and a temperature-sensitive voltage reference generator (TVRG) circuit 234. A calibrated voltage reference generator (CVRG) circuit 236 is coupled to the SIMO buck converter 210, the core LDO voltage regulator 212, and the memory LDO voltage regulator 214. Thus, both voltage compensation and temperature compensation are performed on the voltage sources. A set of current reference circuits 238 is provided as well as a set of voltage reference circuits 240.

In this example, the LDO voltage regulators 212, 214 are optionally used to power up the microcontroller system 100. The more efficient SIMO buck converter 210 is preferably used to power the same components.

A crystal oscillator circuit 242 is coupled to the external crystal 226. The crystal oscillator circuit 242, LFRC oscillator 232, and HFRC oscillator 230 together serve as a set of clock sources 244. The clock sources 244 include multiple clocks providing different frequency signals to the components on the microcontroller system 100.

The analog module 200 also includes a process control monitor (PCM) 250 and a test multiplexor 252. Both the PCM 250 and the test multiplexor 252 allow testing and trimming of the microcontroller system 100 prior to shipment. The PCM 250 includes test structure that allow programming of the compensation voltage regulator 236. The test multiplexor 252 allows trimming of different components on the microcontroller system 100. The analog module 200 includes a power monitoring module 254 that allows power levels to different components on the microcontroller system 100 to be monitored. The power monitoring module 254, in this example, includes multiple state machines that determine when power is required by different components of the microprocessor system 100. The power switch module 216 connects voltages generated by the SIMO buck converter 210 and LDOs 212 and 214 with voltage rails that support components of the microprocessor system 100. The analog module 200 includes a low power audio module 260 for audio channels, a microphone bias module 262 for biasing external microphones, and a general purpose analog to digital converter 264.

Figure 3:
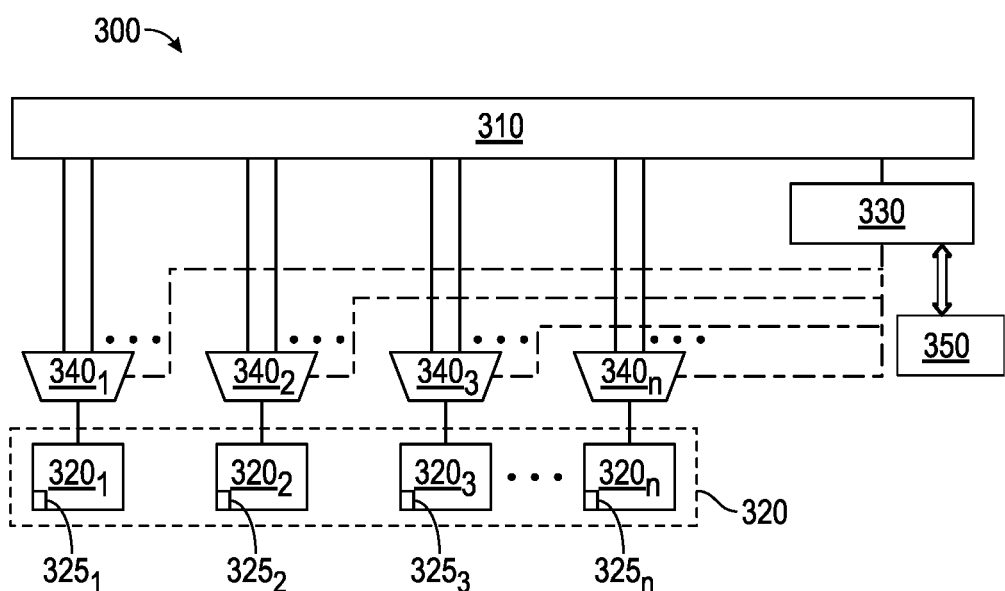
FIG. 3 is a schematic block diagram of a first embodiment of a system including a memory module with fine-grained voltage adjustment, according to certain aspects of the present disclosure.
Figure 4:
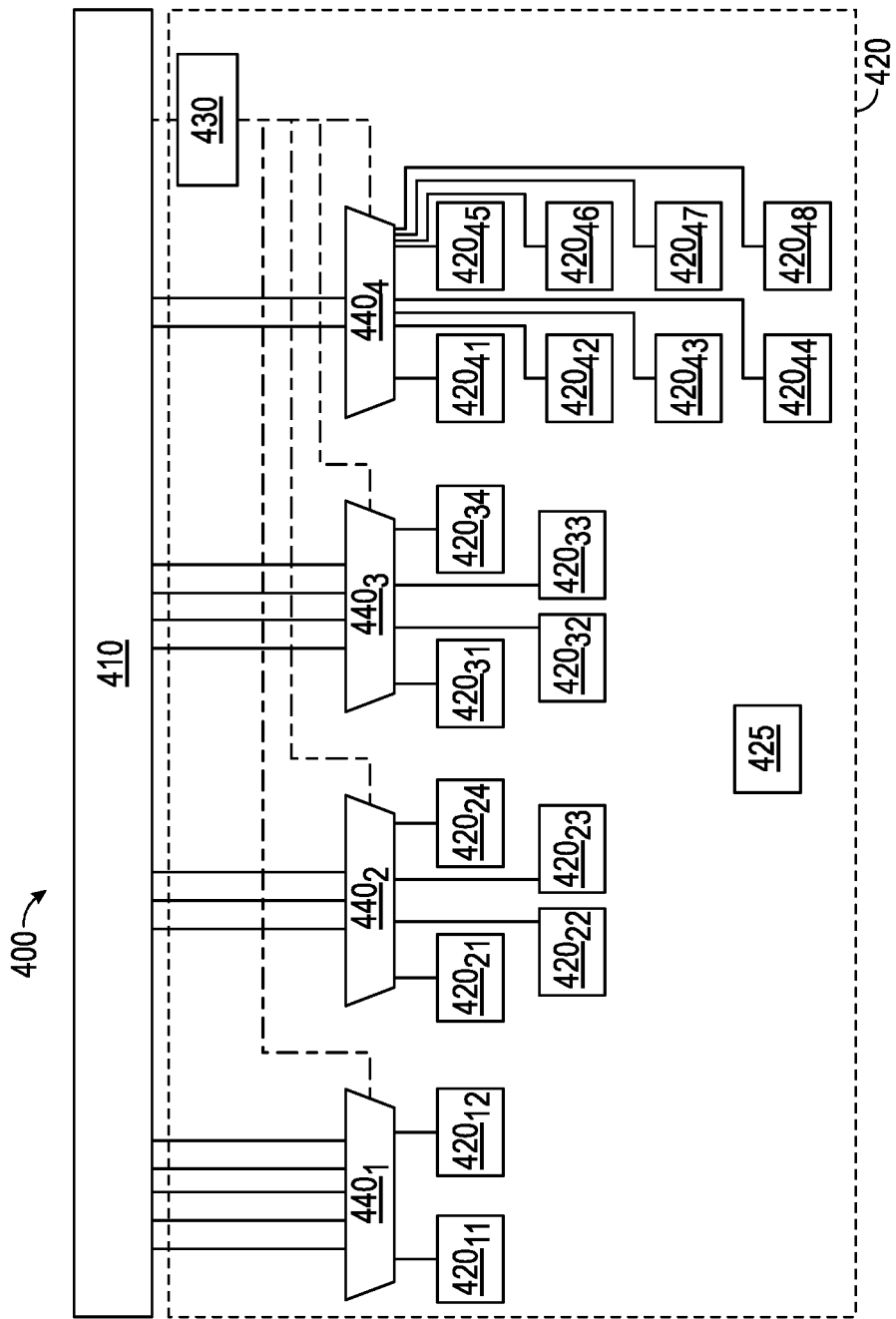
FIG. 4 is a schematic block diagram of a second embodiment of a system including a memory module with fine-grained voltage adjustment, according to certain aspects of the present disclosure.

FIGS. 3-4 show schematic block diagrams of systems 300, 400 including memory modules 320, 420 with fine-grained voltage adjustment capabilities, respectively. In some embodiments, the memory module 320 may be the SRAM 170, the cache 128, or the tightly coupled memory TCM 126 in FIG. 1. The memory module 320 includes one or more memory blocks (alternatively 'arrays', 'macros', or 'banks') $320_1$, $320_2$, $320_3$, . . . , $320n$. The memory blocks $320_1$, $320_2$, $320_3$, . . . , $320_n$ have a structure in which data is stored in bitcells that are arranged in rows and columns. In some embodiments, such as the one shown in FIG. 3, each of the memory blocks $320_1$, $320_2$, $320_3$, . . . , $320n$ is electrically connected to a corresponding one of a plurality of multiplexors $340_1$, $340_2$, $340_3$, . . . , $340n$. However, such 1:1 correspondence between a memory block and a multiplexor may not be implemented in other embodiments, where a single multiplexor may be electrically connected to more than one memory block (e.g., the system 400 of FIG. 4).

In some embodiments, each of the memory blocks $320_1$, $320_2$, $320_3$, . . . , $320n$ includes means for measuring temperature such that the applied voltage can be adjusted based on the temperature of each of the memory blocks $320_1$, $320_2$, $320_3$, . . . , $320n$. In some embodiments, such as in the example embodiment of FIG. 3, this can be accomplished by temperature sensors $3251$, $325_2$, $325_3$, . . . , $325n$ disposed in each of the memory blocks $320_1$, $320_2$, $320_3$, . . . , $320n$. The temperature sensors $3251$, $325_2$, $325_3$, . . . , $325n$ measure temperature via closed-loop hardware or alternatively, via software. In other embodiments, such as the in the example embodiment of FIG. 4, this can be accomplished by a single temperature sensor 425 (FIG. 4). The measured temperature is used for dynamically adjusting the voltage delivered to each of the memory blocks $320_1$, $320_2$, $320_3$, . . . , $320n$. In some embodiments, the temperature can be measured for each of the memory blocks $320_1$, $320_2$, $320_3$, . . . , $320_n$ (FIG. 3), while in others, the temperature can be measured for the entire memory module 420 (FIG. 4).

The system 300 includes a voltage generation module 310, which supplies voltage from a voltage source such a converter or a voltage regulator. In some embodiments of the low power microcontroller system 100, the voltage generation module 310 may be the SIMO buck converter 210 (FIG. 2), which is the main voltage source of the microcontroller system 100 and ensures maximum power efficiency. The SIMO buck converter 210 ensures maximum power efficiency by minimizing the overhead of generating multiple voltage rails. In other embodiments, the voltage generation module 310 may be a voltage regulator such as, but not limited to, a low dropout regulator (LDO), switched capacitance converter, or another step-down voltage regulator that is located proximal to the memory module 320.

The voltage generation module 310 supplies voltage through two or more voltage rails, by electrical connection, to each of the plurality of multiplexors $340_1$, $340_2$, $340_3$, . . . , $340n$. In some embodiments, such as the one shown in FIG. 3, the voltage generation module 310 provides exactly two voltage rails to the inputs to each of the plurality of multiplexors $340_1$, $340_2$, $340_3$, . . . , $340_n$. However, in different embodiments, more than two voltage rails may be connected between the voltage generation module 310 and each of the plurality of multiplexors $340_1$, $340_2$, $340_3$, . . . , $340n$. Each of the voltage rails provide a different voltage option, preset or customizable, to the memory blocks connected through the corresponding multiplexor. For example, two voltage rails from the voltage generation module 310 provides two different voltage options for the memory block $320_1$ through the multiplexor $340_1$, two voltage rails from the voltage generation module 310 provides two different voltage options for the memory block $320_2$ through the multiplexor $340_2$, and so on. Thus, the multiplexors $340_1$, $340_2$, $340_3$, . . . , $340n$ can be controlled via a selection signal to output one of the voltage rails depending on the required voltage to operate the corresponding attached memory block such as the memory block $320_1$.

In some embodiments, the voltage options may be standard (e.g., 0V, 0.3V, 0.4V, 0.5V, 0.7V, 1.8V, etc.) for each of the memory blocks $320_1$, $320_2$, $320_3$, . . . , $320n$. In other embodiments, the voltage options may be unique for each of the memory blocks $320_1$, $320_2$, $320_3$, . . . , $320n$. Further, in some embodiments, the voltage rails may provide a same or a different voltage to each of the memory blocks $320_1$, $320_2$, $320_3$, . . . , $320n$, or across different memory modules 320. The voltage options are generally a function of manufacturing process corners (e.g., voltage is set to a higher value at "slow" process corners and a lower value at "fast" process corners to compensate for manufacturing variations, ensuring that logic gate delay remains approximately constant across all manufacturing conditions), and temperature. For clarity, a "slow" process corner is one in which transistor parameters including, but not limited to, gate length, threshold voltage, and gate oxide thickness are shifted to cause the transistor to operate more slowly than a "typical" transistors. Similarly, a "fast" process corner is one in which transistor parameters are shifted to cause the transistor to operate faster than "typical" transistors.

The temperature based voltage options may include tuning voltage higher at low temperatures for sub-threshold and near-threshold circuits and higher at high temperatures for super-threshold circuits. In conventional circuits, a transistor is operated in either an "off" state or an "on" state. A transistor can transition from the "off" state to the "on" state by applying a voltage across its gate and source terminals that exceeds a value known as the threshold voltage. Conventional circuits typically operate in a super-threshold region with a supply voltage (i.e., VDD) much higher than this threshold voltage to ensure robust operation and that the transistor operates like an ideal "switch." However, it has been shown that a transistor still exhibits switch-like behavior if the supply voltage is only slightly above the threshold voltage (near-threshold operation) or below the threshold voltage (sub-threshold operation).

The voltage options delivered through the voltage rails are calibrated during a manufacturing test phase. Each memory module 320 and process control monitors (e.g., PCM 250 in FIG. 2) therein are observed to determine the correct voltage option and corresponding voltage selection signal for each of the memory blocks $320_1$, $320_2$, $320_3$, . . . , $320_n$, in the memory module 320. This is achieved by applying an initial low voltage option to each of the memory blocks $320_1$, $320_2$, $320_3$, . . . , $320_n$, then observing whether the memory block remains functional. In the case of calibrating a retention voltage, the memory block is placed in deep sleep mode at the initial low voltage for data retention, returned to active mode at a higher safe operating voltage, and then measured to determine whether any bitcells therein are corrupted in the process. In the case of calibrating a functional voltage, the memory block is operated (e.g., read or written) at the initial low voltage, returned to a higher safe operating voltage, and then measured to determine whether any bitcells therein are corrupted in the process. If bitcells in the memory block are corrupted (resulting in a "bad" memory block), a voltage option higher than the initial voltage option is applied, and if bitcells in the memory block are not corrupted (resulting in a "good" memory block), then a lower than the initial voltage option is applied. Thus, an iterative process is used to determine a first known working voltage option at which the bitcells do not get corrupted. Finally, the voltage options deliverable through the voltage rails are determined as the ones having some margin over the first known working voltage options for each of the memory blocks.

The plurality of multiplexors $340_1$, $340_2$, $340_3$, . . . , $340n$ may be located within each of the memory blocks $320_1$, $320_2$, $320_3$, . . . , $320n$, outside the memory blocks but within the memory module 320, or within the voltage generation module 310. Each of the plurality of multiplexors $340_1$, $340_2$, $340_3$, . . . , $340n$ is an independently-controllable electronic device configured to select one or more voltage rails received as input and provide a single output corresponding to the selected voltage rail. Each of the plurality of multiplexors $340_1$, $340_2$, $340_3$, . . . , $340n$ is configured to switch between the two or more voltage rails based on an operational parameter of each of the memory blocks $320_1$, $320_2$, $320_3$, . . . , $320n$. The operational parameter may be a manufacturing process corner of the memory block, a read or write delay, a minimum operating voltage, storage status of the memory block, an operating mode of the memory block, a temperature of the memory block, and the like. In some embodiments, the operating mode of each memory block could be a power mode such as an active mode, a standby mode, and a deep sleep mode. The active mode corresponds to a state where the low power microcontroller system 100 is fully operational. The standby mode corresponds to a state where the low power microcontroller system 100 is in a short period of inactivity, can be intermittently awakened by a sudden activity, and the memory module stores data in a low power or retention mode. The deep sleep mode corresponds to a state where the low power microcontroller system 100 is in a long period of inactivity, and the memory module stores data in a retention mode.

Instead of having a centralized voltage generation module generating multiple rails, a single voltage (or small number of voltages) may be generated that are then distributed to a number of local voltage regulators that serve a single memory block (or a small number of memory blocks). The local voltage regulator can be configured to provide a unique voltage for its own memory block. So instead of providing a selection signal to a local multiplexor, a tuning signal to is provided to the local voltage regulator for a single or multiple memory blocks.

In some embodiments, each of the plurality of multiplexors $340_1$, $340_2$, $340_3$, . . . $340n$ is configured and/or programmed to select the voltage options from the voltage rails. Additionally, or alternatively, the system 300 may include a voltage selection module 330 configured and/or programmed to select the voltage options from the voltage rails. The voltage selection module 330 is electrically connected to each of the plurality of multiplexors $340_1$, $340_2$, $340_3$, . . . , $340n$. The voltage selection module 330 may be implemented as a hardware or a software. When implemented as hardware, the voltage selection module 330 selects voltage options from the voltage rails based on data that may be stored in a memory device 350 in the voltage selection module 330, in a separate dedicated memory module, or in each of the memory blocks $320_1$, $320_2$, $320_3$, . . . , $320n$. The selected voltage options may be set once during a manufacturing test phase (i.e., they are set statically). The selected voltage options may also be periodically updated based on the operational parameter thereof (i.e., the voltage options are dynamically adjusted based on such data). The memory device used to store voltage selection options may be any suitable memory such as an SRAM, a NVM, a set of registers, or the like. When implemented as software, the voltage selection module 330 performs the steps of the method 500 described below.

Whether implemented as hardware or as software, the voltage selection module 330 selects a voltage rail based on the operational parameter of each of the memory blocks $320_1$, $320_2$, $320_3$, . . . , $320n$, such that a voltage required to retain or operate on data therein is minimized, resulting in reduced power consumption during active mode, standby mode, and/or deep sleep mode. The voltage selection module 330 then generates an independent voltage selection signal based on the selected voltage rail. This voltage selection signal is then transmitted to the corresponding one of the plurality of multiplexors $340_1$, $340_2$, $340_3$, . . . , $340n$, which turns on and electrically connects the selected voltage rail to the corresponding one of the memory blocks $320_1$, $320_2$, $320_3$, . . . , $320_n$, for which the voltage rail was selected. The voltage selection signals are generally a function of process corner, temperature, operating mode (e.g., an active mode, a standby node, a deep sleep mode), etc.

Referring to FIG. 4, a schematic block diagram of a system 400 including a memory module 420 with fine-grained voltage adjustment capabilities, is shown. In some embodiments, the memory module 420 may be the SRAM 170, the cache 128, or the tightly coupled memory TCM 126 (FIG. 1). The system 400 represents a different embodiment than the system 300. The memory module 420 includes four groups of memory blocks-(i) a first group having two memory blocks $420_{11}$, $420_{12}$, (ii) a second group having four memory blocks $420_{21}$, $420_{22}$, $420_{23}$, $420_{24}$, (iii) a third group having four memory blocks $420_{31}$, $420_{32}$, $420_{33}$, $420_{34}$, and (iv) a fourth group having eight memory blocks $420_{41}$, $420_{42}$, $420_{43}$, $420_{44}$, $420_{45}$, $420_{46}$, $420_{47}$, $420_{48}$. The first group of memory blocks $420_{11}$, $420_{12}$ is electrically connected to a multiplexor $440_1$, which receives five voltage rails from a voltage generation module 410. The second group of memory blocks $420_{21}$, $420_{22}$, $420_{23}$, $420_{24}$ is electrically connected to a multiplexor $440_2$, which receives three voltage rails from the voltage generation module 410. The third group of memory blocks $420_{31}$, $420_{32}$, $420_{33}$, $420_{34}$ is electrically connected to a multiplexor $440_3$, which receives four voltage rails from the voltage generation module 410. The fourth group of memory blocks $420_{41}$, $420_{42}$, $420_{43}$, $420_{44}$, $420_{45}$, $420_{46}$, $420_{47}$, $420_{48}$ is electrically connected to a multiplexor $440_4$, which receives two voltage rails from the voltage generation module 410. As demonstrated by the example of FIG. 4, any number of memory blocks can be electrically connected to a single multiplexor.

The memory module 420 includes a means for measuring temperature such that the applied voltage can be adjusted based on the temperature of the entire memory module 420. In some embodiments, such as in the example embodiments of FIG. 4, this can be accomplished by a single temperature sensor 425 disposed in the memory module 420. The temperature sensor 425 measures temperature via closed-loop hardware or alternatively, via software. In other embodiments, the temperature of the memory module 420 can be accomplished by a temperature-sensitive analog circuit 425 disposed in the memory module 420. An example of the temperature-sensitive analog circuit 425 is a voltage generator that has been designed to have a tunable complementary-to-absolute temperature (CTAT) characteristic, and thus a known temperature coefficient, such that voltage varies inversely proportional to the measured temperature. The measured temperature is used for dynamically adjusting the voltage delivered to the memory blocks in the memory module 420. This type of dynamic adjustment of voltage is especially useful when the applied voltage is in the near-threshold or sub-threshold range. Circuits operating in near-threshold or sub-threshold range are highly sensitive to temperature, and dynamic adjustment of the voltage can compensate for this sensitivity.

The system 400 includes a voltage generation module 410, which is the same or substantially similar to the voltage generation module 310. In some embodiments of the low power microcontroller system 100, the voltage generation module 410 may be the SIMO buck converter 210 (FIG. 2), which is the main voltage source of the microcontroller system 100 and ensures maximum power efficiency. In other embodiments, the voltage generation module 410 may be a voltage regulator such as, but not limited to, a low dropout regulator (LDO) or another step-down voltage regulator that is located proximal to the memory module 420.

As illustrated by FIG. 4, more than two voltage rails may be connected between the voltage generation module 410 and the multiplexors $440_1$, $440_2$, $440_3$, $440_4$. The number of voltage rails for each of the multiplexors $440_1$, $440_2$, $440_3$, $440_4$ may also be unequal. The voltage generation module 410 supplies voltage through five, three, four, and two voltage rails, by electrical connection, to the multiplexors $440_1$, $440_2$, $440_3$, $440_4$ respectively.

Further, the number of memory blocks receiving voltage connection from the multiplexors $440_1$, $440_2$, $440_3$, $440_4$ may be equal to, greater than or lesser than the number of voltage rails connecting to the multiplexors $440_1$, $440_2$, $440_3$, $440_4$. For example, the multiplexor $440_3$ electrically connects four voltage rails to four memory blocks $420_{31}$, $420_{32}$, $420_{33}$, $420_{34}$; the multiplexor $440_2$ electrically connects three voltage rails to four memory blocks $420_{21}$, $420_{22}$, $420_{23}$, $420_{24}$; the multiplexor $440_4$ electrically connects two voltage rails to two sets of four memory blocks in series $420_{41}$, $420_{42}$, $420_{43}$, $420_{44}$, $420_{45}$, $420_{46}$, $420_{47}$, $420_{49}$; and the multiplexor $440_1$ electrically connects five voltage rails to two memory blocks $420_{11}$, $420_{12}$. The multiplexors $440_1$, $440_2$, $440_3$, $440_4$ are same as or substantially similar to the multiplexors $340_1$, $340_2$, $340_3$, . . . , $340n$, described above with respect to FIG. 3.

As described above with respect to FIG. 3, each of the voltage rails in provide a different voltage option, preset or customizable, to the memory blocks connected through the corresponding multiplexor. Further, each of the voltage rails may deliver a sub-threshold, near-threshold, or super-threshold voltage. In some embodiments, the voltage options for each of the memory blocks $420_{11}$, $420_{12}$, $420_{21}$, $420_{22}$, $420_{23}$, $420_{24}$, $420_{31}$, $420_{32}$, $420_{33}$, $420_{34}$, $420_{41}$, $420_{42}$, $420_{43}$, $420_{44}$, $420_{45}$, $420_{46}$, $420_{47}$, $420_{49}$ may be standard or unique. Further, in some embodiments, the voltage rails may provide a same or a different voltage to each of the memory blocks $420_{11}$, $420_{12}$, $420_{21}$, $420_{22}$, $420_{23}$, $420_{24}$, $420_{31}$, $420_{32}$, $420_{33}$, $420_{34}$, $420_{41}$, $420_{42}$, $420_{43}$, $420_{44}$, $420_{45}$, $420_{46}$, $420_{47}$, $420_{49}$, or across different memory modules 420.

In the example embodiment of FIG. 4, the multiplexors $440_1$, $440_2$, $440_3$, $440_4$ are located within the memory module 420 and outside the memory blocks. Alternatively, the multiplexors $440_1$, $440_2$, $440_3$, $440_4$ may be located within the voltage generation module 410. Each of the multiplexors $440_1$, $440_2$, $440_3$, $440_4$ is configured to switch between the voltage rails based on an operational parameter of each of the four groups having the memory blocks $420_{11}$, $420_{12}$, $420_{21}$, $420_{22}$, $420_{23}$, $420_{24}$, $420_{31}$, $420_{32}$, $420_{33}$, $420_{34}$, $420_{41}$, $420_{42}$, $420_{43}$, $420_{44}$, $420_{45}$, $420_{46}$, $420_{47}$, $420_{48}$ The operational parameter may be a manufacturing process corner of the memory block, a minimum operating voltage, storage status of the memory block, an operating mode of the memory block, a temperature of the memory block, and the like. In some embodiments, the operating mode of each memory block could be a power mode such as an active mode, a functional deep sleep mode, and a baseline deep sleep mode.

In some embodiments, each of the multiplexors $440_1$, $440_2$, $440_3$, $440_4$ is configured and/or programmed via selection signal to select the voltage options from the voltage rails. Additionally, or alternatively, the system 400 may include a voltage selection module 430 configured and/or programmed to select the voltage options from the voltage rails. The voltage selection module 430 is electrically connected to each of the multiplexors $440_1$, $440_2$, $440_3$, $440_4$. The voltage selection module 430 is same or substantially similar to the voltage selection module 330, and may be implemented as a hardware or a software. Similar to the system 300, a separate memory such as registers may be used to store voltage options for each of the memory blocks for the selection signals to each of the multiplexors $440_1$, $440_2$, $440_3$, $440_4$.

Figure 5:
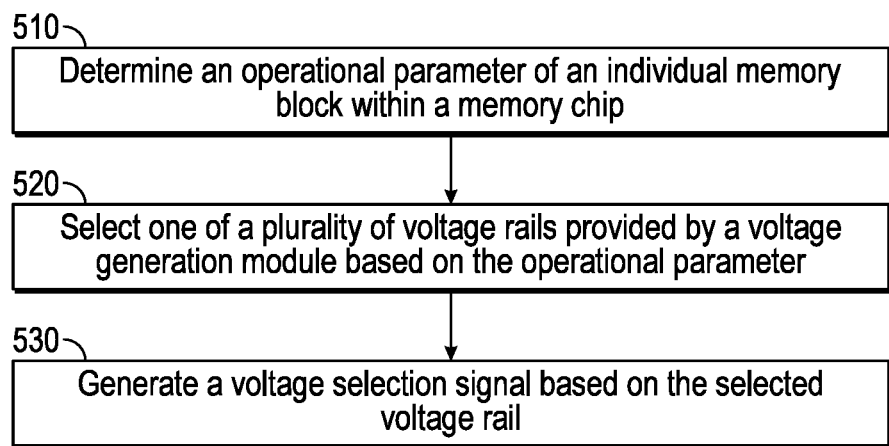
FIG. 5 is a block diagram of a method of providing fine-grained voltage adjustment to a memory module, according to certain aspects of the present disclosure.

FIG. 5 is a block diagram of a method 500 of providing fine-grained voltage adjustment to a memory module such as one of the memory modules in FIGS. 3-4. The method 500 is representative of example machine-readable instructions for providing the voltage adjustment based on workload of the memory module. In this example, the machine readable instructions comprise an algorithm for execution by: (i) a processor; (ii) a controller; and/or (iii) one or more other suitable processing device(s). The algorithm may be embodied in software stored on tangible non-transitory computer-readable media such as flash memory, CD-ROM, floppy disk, hard drive, digital video (versatile) disk (DVD), or other memory devices. However, persons of ordinary skill in the art will readily appreciate that the entire algorithm and/or parts thereof can alternatively be executed by a device other than a processor and/or embodied in firmware or dedicated hardware in a well-known manner (e.g., it may be implemented by an application specific integrated circuit [ASIC], a programmable logic device [PLD], a field programmable logic device [FPLD], a field programmable gate array [FPGA], discrete logic, etc.). For example, any or all of the components of the interfaces can be implemented by software, hardware, and/or firmware. Also, some or all of the machine readable instructions represented by the block diagram of FIG. 5 may be implemented manually. Further, although the example algorithm is described with reference to the block diagram illustrated in FIG. 5, persons of ordinary skill in the art will readily appreciate that many other methods of implementing the example machine readable instructions may alternatively be used. For example, the order of execution of the blocks may be changed, and/or some of the blocks described may be changed, eliminated, or combined.

In some embodiments, the method 500 may be performed by a voltage selection module that is implemented using hardware or software. Example voltage selection modules 330, 430 are described above, with respect to FIG. 3 and FIG. 4, respectively.

The method 500 begins in step 510 where an operational parameter of an individual memory block within a memory module is determined. The memory module includes a plurality of the memory blocks. The operational parameter may be a manufacturing process corner of the memory block, a minimum operating voltage, storage status of the memory block, an operating mode of the memory block, a temperature of the memory block, and the like. In some embodiments, the operating mode is a power mode such as an active mode, a functional deep sleep mode, and a baseline deep sleep mode, as noted above.

In step 520, one of a plurality of voltage rails is selected by a voltage generation module based on the operational parameter. This ensures that a voltage required to retain data in the individual memory block of the memory module is minimized. In some embodiments, the voltage generation module may be a buck converter or a SIMO buck converter that is a central voltage source, as described above. Alternatively, the voltage generation module may be a voltage regulator such as, but not limited to, a low dropout regulator (LDO) or another step-down voltage regulator located proximal to the memory module.

In step 530, a voltage selection signal is generated based on the selected voltage rail. The voltage selection signal is independent for each individual memory block. The voltage selection signal is subsequently transmitted to a multiplexor to electrically connect the individual memory block to the selected voltage rail. The selected voltage rail delivers a voltage which may be sub-threshold, near-threshold, or super-threshold. In some embodiments, the voltage rails may deliver a same or a different voltage to each of the memory blocks, or across different memory modules.

Advantageously, the systems and methods according to the present disclosure provide for fine-grained voltage adjustment capabilities of a memory module in a low power microcontroller system. Customized voltage options supplied to individual memory blocks in the memory module helps minimize power consumption of the memory module during active and deep sleep modes, without compromising the data stored in the memory module.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware, generalized hardware made specialized by the execution of software thereon that enables the hardware to perform specific function, software stored on a computer-readable medium, or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:
1. A system comprising:
a memory module having a plurality of memory blocks, each memory block including a transistor;
a voltage generation module supplying two or more voltage rails at different voltage levels; and
a plurality of multiplexors electrically connected to the voltage generation module, wherein each memory block is electrically connected to one of the plurality of multiplexors, and each multiplexor is configured to select between the two or more voltage rails based on a process corner of the transistor in each memory block.

2. The system of claim 1, further comprising a voltage selection module electrically connected to each of the plurality of multiplexors and configured to select one of the two or more voltage rails for each multiplexor.

3. The system of claim 2, further comprising a data storage device coupled to the voltage selection module to store the selection of the voltage rails for each multiplexor.

4. The system of claim 1, wherein the voltage level of one of the voltage rails is delivered at one of a near-threshold voltage of the transistor, a super-threshold voltage of the transistor, or a sub-threshold voltage of the transistor.

5. The system of claim 1, wherein the voltage level of at least one of the two or more voltage rails changes as a function of temperature.

6. The system of claim 5, wherein the function of temperature is complementary to absolute temperature of the system.

7. The system of claim 1, wherein the process corner is one of a gate length of the transistor, a threshold voltage of the transistor, and a gate oxide thickness of the transistor, or any combination thereof.

8. The system of claim 1, wherein each memory block is operated at a selected power mode including an active mode, a standby mode, and a deep sleep mode.

9. The system of claim 1, wherein a memory block with transistors having a slow process corner is assigned a first voltage and a memory block with transistors having a fast process corner is assigned a second voltage, wherein the first voltage is higher than the second voltage, wherein the slow process corner transistor operates slower than a typical transistor and the fast process corner transistor operates faster than a typical transistor.

10. A method comprising:
determining a process corner of a transistor of an individual memory block within a memory module having a plurality of the memory blocks;
selecting a voltage level from one of a plurality of voltage rails provided by a voltage generation module based on the process corner such that a voltage required to retain data in the individual memory block is minimized;
generating a voltage selection signal based on the selected voltage rail; and
applying the voltage level of the selected voltage rail to the individual memory block.

11. The method of claim 10, further comprising transmitting the voltage selection signal to a multiplexor to electrically connect the individual memory block to the selected voltage rail.

12. The method of claim 10, wherein each memory block is operated at a selected power mode including an active mode, a standby mode, and a deep sleep mode.

13. The method of claim 10, wherein the process corner is one of a gate length of the transistor, a threshold voltage of the transistor, and a gate oxide thickness of the transistor, or any combination thereof.

14. The method of claim 10, wherein a memory block with transistors having a slow process corner is assigned a first voltage and a memory block with transistors having a fast process corner is assigned a second voltage, wherein the first voltage is higher than the second voltage, wherein the slow process corner transistor operates slower than a typical transistor and the fast process corner transistor operates faster than a typical transistor.

15. The method of claim 10, wherein the voltage level of one of the voltage rails is delivered at one of a near-threshold voltage of the transistor, a super-threshold voltage of the transistor, or a sub-threshold voltage of the transistor.

16. A non-transitory computer-readable medium having machine-readable instructions stored thereon, which when executed by a processor, cause the processor to:
determine a process corner of a transistor of an individual memory block within a memory module having a plurality of the memory blocks;
select a voltage level from one of a plurality of voltage rails provided by a voltage generation module based on the process corner such that a voltage required to retain data in the individual memory block is minimized; and
generate a voltage selection signal based on the selected voltage rail.

17. The non-transitory computer-readable medium of claim 16, further storing machine-readable instructions that cause the processor to transmit the voltage selection signal to a multiplexor to electrically connect the individual memory block to the selected voltage rail.

18. The non-transitory computer-readable medium of claim 16, wherein the process corner is one of a gate length of the transistor, a threshold voltage of the transistor, and a gate oxide thickness of the transistor, or any combination thereof.

19. The non-transitory computer-readable medium of claim 16, wherein the operating mode of each memory block is a power mode including an active mode, a standby mode, and a deep sleep mode.

20. The non-transitory computer-readable medium of claim 16, wherein the voltage level of one of the voltage rails is delivered at one of a near-threshold voltage of the transistor, a super-threshold voltage of the transistor, or a sub-threshold voltage of the transistor.

* * * * *